(12) United States Patent
Yang et al.

(10) Patent No.: US 12,166,140 B2
(45) Date of Patent: Dec. 10, 2024

(54) SOLAR CELL AND MANUFACTURE METHOD THEREOF, AND PHOTOVOLTAIC MODULE

(71) Applicant: ZHEJIANG JINKO SOLAR CO., LTD., Zhejiang (CN)

(72) Inventors: Nannan Yang, Zhejiang (CN); Jingsheng Jin, Zhejiang (CN); Bike Zhang, Zhejiang (CN)

(73) Assignee: Zhejiang Jinko Solar Co., Ltd., Zhejiang (CN)

( * ) Notice: Subject to any disclaimer, the term of this patent is extended or adjusted under 35 U.S.C. 154(b) by 38 days.

(21) Appl. No.: 17/879,687

(22) Filed: Aug. 2, 2022

(65) Prior Publication Data
US 2023/0387336 A1 Nov. 30, 2023

(30) Foreign Application Priority Data
May 31, 2022 (CN) .......................... 202210606614.9

(51) Int. Cl.
*H01L 31/0352* (2006.01)
*H01L 31/0216* (2014.01)
(Continued)

(52) U.S. Cl.
CPC .. *H01L 31/035272* (2013.01); *H01L 31/1804* (2013.01); *H01L 31/02168* (2013.01); *H01L 31/022425* (2013.01); *H01L 31/0288* (2013.01)

(58) Field of Classification Search
CPC ....... H01L 31/035272; H01L 31/02168; H01L 31/022425; H01L 31/0288; H01L 31/0747;
(Continued)

(56) References Cited

U.S. PATENT DOCUMENTS 11,114,575 B1 * 9/2021 Jin .................. H01L 31/022425
11,189,739 B1 11/2021 Jin et al.
(Continued)

FOREIGN PATENT DOCUMENTS

CN 104769725 A 7/2015
CN 111952153 A 11/2020
(Continued)

OTHER PUBLICATIONS

CN-112103364-A English machine translation (Year: 2020).*
(Continued)

*Primary Examiner* — Andrew J Golden
(74) *Attorney, Agent, or Firm* — Knobbe, Martens, Olson & Bear, LLP

(57) ABSTRACT

A solar cell is provided, including: a semiconductor substrate including a front surface and a rear surface arranged opposite to each other; an emitter located on the front surface of the semiconductor substrate; a front passivation layer located over the front surface of the semiconductor substrate; a tunneling layer located over the rear surface of the semiconductor substrate; a doped conductive layer located over a surface of the tunneling layer; a rear passivation layer located over a surface of the doped conductive layer; a front electrode in contact with the emitter; and a rear electrode in contact with the first doped conductive layer. The doped conductive layer includes a first doped conductive layer corresponding to a rear metallized region, and a second doped conductive layer corresponding to a rear non-metallized region. The first doped conductive layer has an oxygen content less than the second doped conductive layer.

17 Claims, 4 Drawing Sheets

(51) Int. Cl.
*H01L 31/0224* (2006.01)
*H01L 31/0288* (2006.01)
*H01L 31/18* (2006.01)

(58) Field of Classification Search
CPC ............... H01L 31/0745; H01L 31/062; H01L 31/022441
See application file for complete search history.

(56) References Cited

U.S. PATENT DOCUMENTS

| | | |
|---|---|---|
| 2009/0211635 A1 | 8/2009 | Niira et al. |
| 2009/0266396 A1 | 10/2009 | Niira et al. |
| 2014/0090701 A1 | 4/2014 | Rim et al. |
| 2016/0056322 A1 | 2/2016 | Yang et al. |
| 2016/0276515 A1 | 9/2016 | Chang et al. |
| 2018/0138334 A1 | 5/2018 | Lee et al. |
| 2018/0204962 A1 | 7/2018 | Choi et al. |

FOREIGN PATENT DOCUMENTS

| | | | | |
|---|---|---|---|---|
| CN | 112103364 A | * | 12/2020 | ..... H01L 31/022425 |
| CN | 112289873 A | * | 1/2021 | ....... H01L 21/02057 |
| CN | 112310232 A | | 2/2021 | |
| CN | 112331742 A | | 2/2021 | |
| CN | 112993073 U | | 3/2021 | |
| CN | 113345969 A | * | 9/2021 | |
| CN | 113471305 A | | 10/2021 | |
| CN | 114038921 A | | 2/2022 | |
| CN | 114242803 A | | 3/2022 | |
| CN | 114242809 A | | 3/2022 | |
| EP | 2581950 A2 | | 4/2013 | |
| EP | 3113234 A1 | | 1/2017 | |
| EP | 4002495 A2 | | 5/2022 | |
| JP | 2016046525 A | | 4/2016 | |
| JP | 2019041131 A | | 3/2019 | |
| TW | 201911588 A | | 3/2019 | |
| WO | 2013001863 A1 | | 1/2013 | |
| WO | 2019021545 A1 | | 1/2019 | |

OTHER PUBLICATIONS

CN-113345969-A English machine translation (Year: 2021).*
Notice of Allowance in Chinese Application No. CN 202210606614.9 dated Aug. 18, 2022 in 4 pages.
Office Action in Chinese Application No. CN 202210606614.9 dated Jul. 21, 2022 in 9 pages.
Office Action in Japanese Application No. JP 2022-102818 dated Sep. 13, 2022 in 6 pages.
Haase et al., "Cells and modules with passivating contacts—POLO technology", ISFH, 2019, 13 pages.
Scala et al., "Impact of arsenic and phosphorus concentration on oxygen content in heavily doped Silicon Single crystal", Journal of Crystal Growth, vol. 545, 2020, 4 pages.
Office Action received in Australian Application No. 2022209315 dated Jul. 27, 2023 in 10 pages.
Extended European Search Report received in European Application No. 22187907.5 dated Jun. 19, 2023 in 12 pages.

* cited by examiner

SOLAR CELL AND MANUFACTURE METHOD THEREOF, AND PHOTOVOLTAIC MODULE

CROSS-REFERENCE TO RELATED APPLICATIONS

The present application claims priority to Chinese Application No. 202210606614.9, filed on May 31, 2022, the content of which is incorporated herein by reference in its entirety.

TECHNICAL FIELD

The present disclosure relates to the technical field of solar photovoltaic modules and, in particular, to a solar cell, a method for manufacturing a solar cell, and a photovoltaic module.

BACKGROUND

TOPCon refers to a tunnel oxide passivated contact cell based on the principle of selective carriers. The TOPCon cell has an N-type silicon substrate cell structure, in which an ultra-thin layer of silicon oxide is manufactured on a rear surface of the cell and then a thin layer of doped silicon is deposited to form a passivated contact structure, which effectively reduces surface recombination and metal contact recombination, and thereby providing more space for further improvement of conversion efficiency of the cell.

The TOPCon cell has high conversion efficiency. However, the manufacturing of the passivated contact structure causes the manufacturing process of the TOPCon solar cell to be relatively complex, resulting in high manufacturing costs of the TOPCon solar cell and limited improvement of the conversion efficiency. Therefore, how to improve the conversion efficiency of the TOPCon solar cell has put forward higher requirements on the manufacturing of solar cells, and has also become an urgent problem for the photovoltaic industry.

SUMMARY

In order to overcome the above defects, the present disclosure provides a solar cell and a method for manufacturing a solar cell, and a photovoltaic module, which can ensure passivation performance of metallized regions, reduce metal contact of the solar cell and ensure an open-circuit voltage, thereby improving the efficiency and performance of the solar cell.

In a first aspect, according to some embodiments of the present disclosure, a solar cell is provided, including: a semiconductor substrate including a front surface and a rear surface arranged opposite to each other; an emitter located on the front surface of the semiconductor substrate; a front passivation layer located over the front surface of the semiconductor substrate; a tunneling layer located over the rear surface of the semiconductor substrate; a doped conductive layer located over a surface of the tunneling layer; a rear passivation layer located over a surface of the doped conductive layer; a front electrode in contact with the emitter; and a rear electrode in contact with the first doped conductive layer. The doped conductive layer includes a first doped conductive layer corresponding to a rear metallized region, and a second doped conductive layer corresponding to a rear non-metallized region. The first doped conductive layer has an oxygen content less than the second doped conductive layer.

In one or more embodiments, the tunneling layer includes a first tunneling layer corresponding to the rear metallized region and a second tunneling layer corresponding to the rear non-metallized region, and the first tunneling layer has an oxygen content greater than the second tunneling layer.

In one or more embodiments, the tunneling layer includes a first tunneling layer corresponding to the rear metallized region and a second tunneling layer corresponding to the rear non-metallized region, and an oxygen content at an interface between the first doped conductive layer and the first tunneling layer is greater than an oxygen content at an interface between the second doped conductive layer and the second tunneling layer.

In one or more embodiments, an oxygen content at an interface between the first doped conductive layer and the rear passivation layer is greater than an oxygen content at an interface between the second doped conductive layer and the rear passivation layer.

In one or more embodiments, the oxygen content of the first doped conductive layer is less than the oxygen content of the first tunneling layer.

In one or more embodiments, a mass ratio of oxygen element in the first doped conductive layer ranges from 19% to 22%.

In one or more embodiments, a mass ratio of oxygen element in the first tunneling layer ranges from 25% to 30%.

In one or more embodiments, the first doped conductive layer has a nitrogen content greater than the second doped conductive layer.

In one or more embodiments, a mass ratio of nitrogen element in the first doped conductive layer ranges from 3% to 5%.

In one or more embodiments, the doped conductive layer comprises at least one of silicon carbide or polysilicon.

In one or more embodiments, the first doped conductive layer and the second doped conductive layer are phosphorus-doped layers, and a concentration of phosphorus element in the first doped conductive layer is greater than a concentration of phosphorus element in the second doped conductive layer.

In one or more embodiments, the concentration of phosphorus element in the first doped conductive layer ranges from $1E20$ $cm^{-3}$ to $1E21$ $cm^{-3}$, and the concentration of phosphorus element in the second doped conductive layer ranges from $8E19$ $cm^{-3}$ to $5E20$ $cm^{-3}$; and/or a sheet resistance of the first doped conductive layer ranges from 30 $\Omega/sq$ to 80 $\Omega/sq$, and a sheet resistance of the second doped conductive layer ranges from 60 $\Omega/sq$ to 400 $\Omega/sq$; and/or the first doped conductive layer has a thickness in a range of 30 nm to 300 nm, and the second doped conductive layer has a thickness in a range of 30 nm to 300 nm.

In a second aspect, the present disclosure provides a method for manufacturing a solar cell, including: forming an emitter on a front surface of a textured semiconductor substrate; forming a tunneling layer and a conductive layer over a rear surface of the semiconductor substrate, and doping and locally laser-treating the conductive layer to form a doped conductive layer, the doped conductive layer includes a first doped conductive layer corresponding to a rear metallized region and a second doped conductive layer corresponding to a rear non-metallized region, and the first doped conductive layer has an oxygen content less than the second doped conductive layer; forming a rear passivation layer over surfaces of the first doped conductive layer and the second doped conductive layer, and forming a front passivation layer over a surface of the emitter; and penetrating the rear passivation layer to form a rear electrode in contact with the first doped conductive layer, and penetrating the front passivation layer to form a front electrode in contact with the emitter.

In one or more embodiments, subsequent to doping and locally laser-treating the conductive layer, the tunneling layer includes a first tunneling layer corresponding to the rear metallized region and a second tunneling layer corresponding to the rear non-metallized region, wherein the first tunneling layer has an oxygen content greater than the second tunneling layer.

In one or more embodiments, subsequent to doping and locally laser-treating the conductive layer, the tunneling layer includes a first tunneling layer corresponding to the rear metallized region and a second tunneling layer corresponding to the rear non-metallized region, wherein an oxygen content at an interface between the first doped conductive layer and the first tunneling layer is greater than an oxygen content at an interface between the second doped conductive layer and the second tunneling layer.

In one or more embodiments, subsequent to doping and locally laser-treating the conductive layer, an oxygen content at an interface between the first doped conductive layer and the rear passivation layer is greater than an oxygen content at an interface between the second doped conductive layer and the rear passivation layer.

In one or more embodiments, subsequent to doping and locally laser-treating the conductive layer, the tunneling layer includes a first tunneling layer corresponding to the rear metallized region and a second tunneling layer corresponding to the rear non-metallized region, and the oxygen content of the first doped conductive layer is less than the oxygen content of the first tunneling layer.

In one or more embodiments, subsequent to doping and locally laser-treating the conductive layer, the first doped conductive layer has a nitrogen content greater than the second doped conductive layer.

In one or more embodiments, a doping source for doping and locally laser-treating the conductive layer is a phosphorus source, and a concentration of phosphorus element in the first doped conductive layer is greater than a concentration of phosphorus element in the second doped conductive layer.

In a third aspect, according to some embodiments of the present disclosure, a photovoltaic module is provided, the photovoltaic module includes a cover plate, a packaging material layer, and a solar cell string, and the solar cell string includes a plurality of solar cells described in the first aspect and/or manufactured according to the second aspect.

Other features and advantages of embodiments of the present disclosure will be set forth in the specification which follows and in part will become apparent from the specification or may be learned from practice of the embodiments of the present disclosure. The objectives and other advantages of the embodiments of the present disclosure may be realized and attained by the structure particularly pointed out in the specification and the accompanying drawings.

BRIEF DESCRIPTION OF DRAWINGS

In order to better illustrate the technical solutions in embodiments of the present disclosure, the accompanying drawings used in the description of the embodiments will be introduced below. It is apparent that, the accompanying drawings in the following description are only some embodiments of the present disclosure, and other drawings can be obtained by those of ordinary skill in the art from the provided drawings without creative efforts.

DESCRIPTION OF EMBODIMENTS

Figure 1:
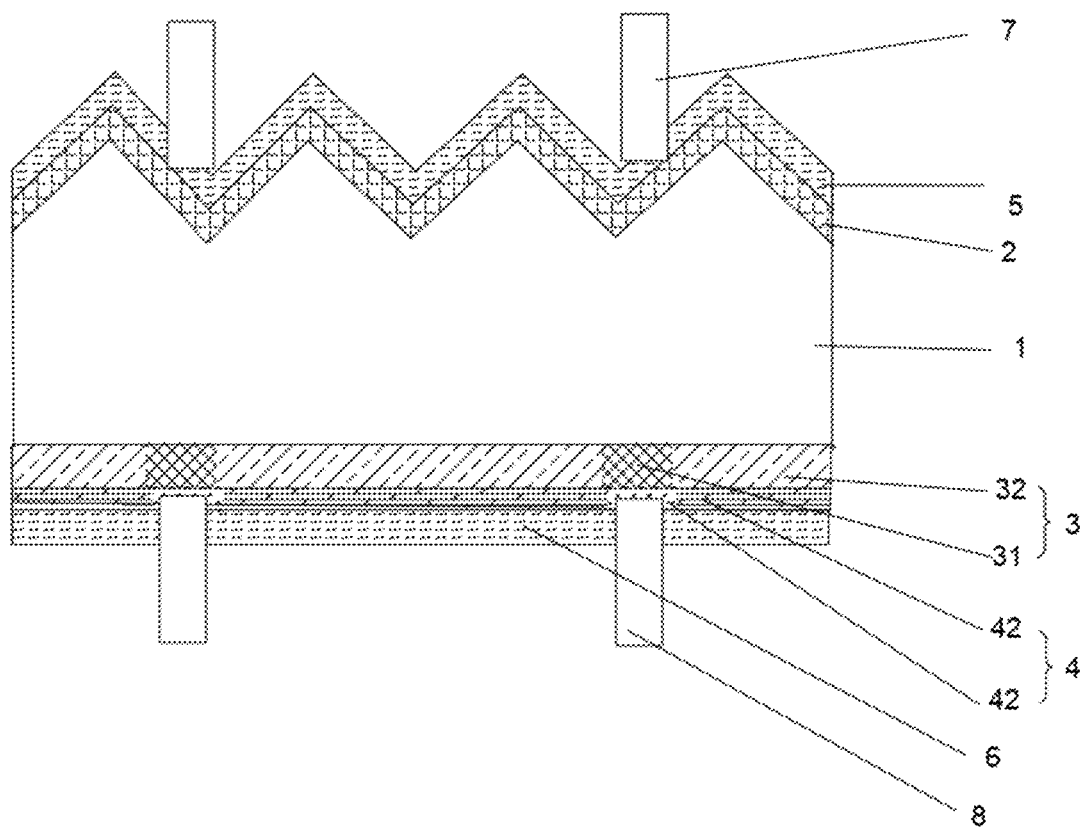
FIG. 1 is a schematic structural diagram of a solar cell according to one or more embodiments of the present disclosure.

In order to better understand the technical solution of the present disclosure, embodiments of the present disclosure are described in detail below with reference to the accompanying drawings.

It is to be made clear that the described embodiments are only some rather than all of the embodiments of the present disclosure. All other embodiments obtained by those of ordinary skill in the art based on the embodiments in the present disclosure without creative efforts fall within the protection scope of the present disclosure.

The terms used in the embodiments of the present disclosure are intended only to describe particular embodiments and are not intended to limit the present disclosure. As used in the embodiments of the present disclosure and the appended claims, the singular forms of "a/an", "the", and "said" are intended to include plural forms, unless otherwise clearly specified by the context.

It is to be understood that the term "and/or" used herein is merely an association relationship describing associated objects, indicating that three relationships may exist. For example, A and/or B indicates that there are three cases of A alone, A and B together, and B alone. In addition, the character "I" herein generally means that associated objects before and after it have an "or" relationship.

It is to be noted that the location terms such as "above", "below", "left", and "right" described in the embodiments of the present disclosure are described with reference to the perspectives shown in the accompanying drawings, and should not be construed as limitations on the embodiments of the present disclosure. In addition, in the context, it is to be further understood that, when one element is referred to as being connected "above" or "below" another element, the one element may be directly connected "above" or "below" the other element, or connected "above" or "below" the other element via an intermediate element.

It is to be noted that the steps shown in a flowchart of the accompanying drawings may be performed, for example, in a computer system by a group of computer executable instructions. In addition, although a logical order is shown in the flowchart, the order of the steps of each embodiment is not limited to the order provided in this specification. In some cases, the implementation steps may be adjusted according to specific requirements, and the steps shown or described are performed in a different order than the order shown here.

It is to be further noted that, in the present disclosure, the term "metallized region" refers to a region of the front surface or back surface of the solar cell forming an electrode, and the term "non-metallized region" refers to a region of the front surface or back surface of the solar cell not forming an electrode.

A TOPCon solar cell relies on a "tunneling effect" to achieve rear surface passivation. An existing rear surface structure of the TOPCon solar cell includes a semiconductor substrate, a tunneling oxide layer, a doped polysilicon layer, a rear-surface passivation layer, and a rear-surface metal electrode sequentially from inside to outside. The metal electrode forms ohmic contact with a semiconductor, and the tunneling oxide layer and the doped polysilicon layer form a tunneling oxide layer passivated contact structure. In order to further improve the conversion efficiency and performance of solar cells, how to reduce contact resistance in a metallized region has become an urgent problem to be solved in the photovoltaic industry.

People begin to improve the manufacturing process of solar cells, in which heavy doping is performed in a metallized region by laser doping, so as to reduce contact resistance in the metallized region and improve conversion efficiency of the solar cell. However, it is inevitable to cause certain damages to films of the solar cells during laser treatment, which leads to degradation of the performance of the solar cells.

Therefore, in order to improve the conversion efficiency and performance of the solar cells, the present disclosure proposes a solar cell. As shown in FIG. 1, the solar cell includes: a semiconductor substrate 1, the semiconductor substrate 1 includes a front surface and a rear surface arranged opposite to each other; an emitter 2 and a front passivation layer 5 that are located on the front surface of the semiconductor substrate 1; a tunneling layer 3, a doped conductive layer 4, and a rear passivation layer 6 that are located on the rear surface of the semiconductor substrate 1, the doped conductive layer 4 includes a first doped conductive layer 41 corresponding to a rear metallized region and a second doped conductive layer 42 corresponding to a rear non-metallized region, and oxygen content of the first doped conductive layer 41 is less than the second doped conductive layer 42; and a front electrode 7 in contact with the emitter 2, and a rear electrode 8 in contact with the first doped conductive layer 41.

In the above solution, the oxygen content of the first doped conductive layer 41 is controlled to be less than the second doped conductive layer 42, so that the doped conductive layer 4 on the rear surface of the solar cell has a selective structure, greater oxygen content of the second doped conductive layer 42 enables reduction of metal recombination centers and improvement of the passivation effect, and smaller oxygen content of the first doped conductive layer 41 enables doped polysilicon in a metal region to have better conductivity, thereby reducing metal contact of the solar cell and ensuring an open-circuit voltage, and thus improving the performance and conversion efficiency of the solar cell.

The front surface of the semiconductor substrate 1 is a surface facing the sun (i.e., light receiving surface), and the rear surface of the semiconductor substrate 1 is a surface facing away from the sun (i.e., backlight surface). In some embodiments, the semiconductor substrate 1 is an N-type semiconductor substrate. The N-type semiconductor substrate may be a crystalline silicon substrate (silicon substrate), for example, any one of a monocrystalline silicon substrate, a polycrystalline silicon substrate, a microcrystalline silicon substrate, or a silicon carbide substrate. The specific type of the semiconductor substrate is not limited in the present disclosure. Doping elements of the semiconductor substrate may be phosphorus, nitrogen, and the like.

In some embodiments, the N-type semiconductor substrate is an N-type crystalline silicon (or silicon wafer). The N-type semiconductor substrate has a thickness in a range of 60 μm to 240 μm, which may be, for example, 60 μm, 80 μm, 90 μm, 100 μm, 120 μm, 150 μm, 200 μm, 240 μm, or the like, which is not limited herein.

In some embodiments, the emitter 2 is a P-type emitter. The P-type emitter is a boron-doped diffusion layer. The boron-doped diffusion layer is a P-type emitter (i.e., P+ layer) formed by using a boron source to diffuse boron atoms to a certain depth of the front surface through a diffusion process. For example, the boron source may be liquid boron tribromide or boron trichloride.

In some embodiments, the tunneling layer 3 is a thin oxide layer, which may be, for example, a silicon oxide or metal oxide, and may contain other additional elements such as nitrogen. For example, the tunneling layer 3 may have a stack structure of one or more of a silicon oxide layer, an alumina layer, a silicon oxynitride layer, a molybdenum oxide layer, or a hafnium oxide layer. In some other embodiments, the tunneling layer 3 may also be an oxygen-containing silicon nitride layer, an oxygen-containing silicon carbide layer, or the like. The tunneling layer may not have perfect tunneling barriers in practice due to defects such as pinholes, which can cause other charge carrier transport mechanisms (such as drift, diffusion) to dominate the tunneling effect.

In some embodiments, the tunneling layer 3 has a thickness in a range of 0.8 nm to 2 nm. For example, the thickness of the tunneling layer 3 may be 0.8 nm, 0.9 nm, 1.0 nm, 1.2 nm, 1.4 nm, 1.6 nm, 1.8 nm, 2 nm, or the like. The thickness of the tunneling layer 3 refers to a thickness of the tunneling layer relative to a plane where it is formed. If the tunneling layer 3 has an excessively large thickness, it is not conducive to reducing contact resistance of the tunneling layer. Reduction of a filling factor caused by the contact resistance can be suppressed by controlling the thickness of the tunneling layer. According to some embodiments of the present disclosure, the tunneling layer is formed on the rear surface of the semiconductor substrate 1, so that an open-circuit voltage of the solar cell can be increased and thus the efficiency of the solar cell can be improved. In some embodiments, content of oxygen elements in the first doped conductive layer 41 ranges from 19% to 22%. The content of oxygen elements in the first doped conductive layer 41 may be, for example, 19%, 19.5%, 19.7%, 20.5%, 20.8%, 21%, 21.3%, 21.5%, 21.8%, or 22%. Content of oxygen elements in the second doped conductive layer 42 ranges from 27% to 28%. The content of oxygen elements in the second doped conductive layer 42 may be, for example, 27%, 27.02%, 27.5%, 27.85%, 28% or the like.

In some embodiments, the tunneling layer 3 includes a first tunneling layer 31 corresponding to the rear metallized region and a second tunneling layer 32 corresponding to the rear non-metallized region, and oxygen content of the first tunneling layer 31 is greater than the second tunneling layer 32. Content of oxygen elements in the first tunneling layer 31 ranges from 25% to 30%. The content of oxygen elements in the first tunneling layer 31 may be, for example, 25%, 26%, 27%, 28%, 29%, or 30%. The content of oxygen elements in the second tunneling layer 32 may be, for example, 17%, 17.5%, 18%, 18.3%, or 19%. According to the present disclosure, the oxygen content of the first tunneling layer 31 is controlled to be greater than the second tunneling layer 32, that is, a larger amount of bridging oxygen is present in the first tunneling layer 31, so that density of the first tunneling layer 31 is increased, which prevents the presence of holes in the tunneling layer. In addition, the lower oxygen content of the second tunneling layer 32 ensures the tunneling effect, thereby improving the passivation effect of the solar cell.

In some embodiments, oxygen content at an interface between the first doped conductive layer 41 and the first tunneling layer 31 is greater than at an interface between the second doped conductive layer 42 and the second tunneling layer 32. The control of the oxygen content at the interfaces between the doped conductive layer 4 and the tunneling layer 3 can improve the film quality of the tunneling layer 3 in the metallized region and can further improve the passivation effect of the solar cell.

In some embodiments, oxygen content at an interface between the first doped conductive layer 41 and the rear passivation layer 6 is greater than at an interface between the second doped conductive layer 42 and the rear passivation layer 6. According to some embodiments of the present disclosure, the control over the oxygen content at the interfaces between the doped conductive layer 4 and the rear passivation layer 6 can improve the film quality of the tunneling layer in the metallized region and can further improve the passivation effect of the solar cell.

In some embodiments, the oxygen content of the first doped conductive layer 41 is less than the first tunneling layer 31. Higher oxygen content of the first tunneling layer 31 enables an increase of the density of the first tunneling layer 31 and improvement of safety during using of the semiconductor substrate 1 and the first tunneling layer 31.

In some embodiments, nitrogen content of the first doped conductive layer 41 is greater than the second doped conductive layer 42.

In some embodiments, a mass ratio of nitrogen elements in the first doped conductive layer 41 ranges from 3% to 5%. The mass ratio of nitrogen elements in the first doped conductive layer 41 may be, for example, 3%, 3.5%, 4%, 4.5%, or 5%.

In some embodiments, a mass ratio of nitrogen elements in the second doped conductive layer 42 ranges from 1% to 2%. The mass ratio of nitrogen elements in the second doped conductive layer 42 may be, for example, 1%, 1.1%, 1.2%, 1.3%, 1.4%, 1.5%, 1.6%, 1.7%, 1.8%, 1.9%, or 2%.

In some embodiments, the doped conductive layer 4 includes at least one of silicon carbide or polysilicon. That is, the doped conductive layer 4 may be a doped polysilicon layer, or a silicon carbide layer, or a composite layer of a doped polysilicon layer and a silicon carbide layer. Dopants of the first doped conductive layer 41 and the second doped conductive layer are n-type dopants. The n-type dopants may be, for example, n-type impurities of Group-V elements (including P, As, Bi, Sb, etc.).

In some embodiments, when the doped conductive layer 4 is a doped polysilicon layer, doping elements in the doped polysilicon layer 4 are phosphorus elements. That is, the first doped conductive layer 41 and the second doped conductive layer 42 are phosphorus-doped polysilicon layers. Concentration of phosphorus elements in the first doped conductive layer 41 is greater than phosphorus elements in the second doped conductive layer 42, so that the first doped conductive layer 41 is heavily doped in the metallized region, thereby improving the passivation effect of the metallized region.

In some embodiments, the concentration of phosphorus elements in the first doped conductive layer 41 ranges from $1E20$ $cm^{-3}$ to $1E21$ $cm^{-3}$. The concentration of phosphorus elements in the first doped conductive layer 41 may be, for example, $1E20$ $cm^{-3}$, $2E20$ $cm^{-3}$, $3E20$ $cm^{-3}$, $4E20$ $cm^{-3}$, $5E20$ $cm^{-3}$, $6E20$ $cm^{-3}$, $7E20$ $cm^{-3}$, $8E20$ $cm^{-3}$, $9E20$ $cm^{-3}$, or $1E21$ $cm^{-3}$.

In some embodiments, the concentration of phosphorus elements in the second doped conductive layer 42 ranges from $8E19$ $cm^{-3}$ to $5E20$ $cm^{-3}$. The concentration of phosphorus elements in the second doped conductive layer 42 may be, for example, $8E19$ $cm^{-3}$, $9E19$ $cm^{-3}$, $1E20$ $cm^{-3}$, $2E20$ $cm^{-3}$, $3E20$ $cm^{-3}$, $4E20$ $cm^{-3}$, or $5E20$ $cm^{-3}$.

It may be understood that the concentration of phosphorus elements in the first doped conductive layer 41 and the second doped conductive layer 42 is controlled within the above ranges, so that a selective structure is formed on the rear surface of the solar cell. That is, the first doped conductive layer 41 located in the metallized region is an n++ heavily doped region, and the second doped conductive layer 42 located in the non-metallized region is an n+ polysilicon layer, so as to reduce contact resistance of the metallized region and increase the filling factor of the solar cell, thereby improving performance of the solar cell.

In some embodiments, sheet resistance of the first doped conductive layer 41 ranges from 30 Ω/sq to 80 Ω/sq. The sheet resistance of the first doped conductive layer 41 may be, for example, 30 Ω/sq, 40 Ω/sq, 50 Ω/sq, 60 Ω/sq, 70 Ω/sq, or 80 Ω/sq.

In some embodiments, sheet resistance of the second doped conductive layer 42 ranges from 60 Ω/sq to 400 Ω/sq. The sheet resistance of the second doped conductive layer 42 may be, for example, 60 Ω/sq, 80 Ω/sq, 100 Ω/sq, 150 Ω/sq, 200 Ω/sq, 300 Ω/sq, or 400 Ω/sq.

In some embodiments, the first doped conductive layer 41 has a thickness in a range of 30 nm to 300 nm. The thickness of the first doped conductive layer 41 may be, for example, 30 nm, 50 nm, 70 nm, 90 nm, 110 nm, 150 nm, 200 nm, 250 nm, or 300 nm.

In some embodiments, the second doped conductive layer 42 has a thickness in a range of 30 nm to 300 nm. The thickness of the second doped conductive layer 42 may be, for example, 30 nm, 50 nm, 70 nm, 90 nm, 110 nm, 150 nm, 200 nm, 250 nm, or 300 nm.

It may be understood that the first doped conductive layer 41 and the second doped conductive layer 42 may have an identical thickness. That is, in some embodiments of the present disclosure, the passivation effect of the solar cell can be improved and conductivity and the filling factor can be increased only by changing distribution of heavily doped elements in the first doped conductive layer 41 and the second doped conductive layer 42, thereby improving the performance of the solar cell.

In some embodiments, the front passivation layer 5 may include, but is not limited to, at least one of silicon oxide, silicon nitride, silicon oxynitride, alumina, or any combination thereof. The front passivation layer 5 can produce a good passivation effect on the semiconductor substrate 1, which is helpful to improve the conversion efficiency of the solar cell. It is to be noted that the front passivation layer 5 can also serve to reduce the reflection of incident light, which may also be referred to as an anti-reflection layer in some embodiments.

In some embodiments, the front passivation layer 5 has a thickness in a range of 10 nm to 120 nm, which may be, for example, 10 nm, 20 nm, 30 nm, 42 nm, 50 nm, 60 nm, 70 nm, 80 nm, 90 nm, 100 nm, 120 nm, or the like, and may also be other values in the above range, which is not limited herein.

In some embodiments, the rear passivation layer 6 may include, but is not limited to, at least one of silicon oxide, silicon nitride, silicon oxynitride, and alumina, or any combination thereof. When the rear passivation layer 6 is a stack of a silicon nitride layer and a silicon oxide layer, or a stack of a silicon nitride layer and a silicon oxynitride layer, the silicon nitride layer is located on a surface of the doped conductive layer 4, and the silicon oxide layer or the silicon oxynitride layer is located on a surface of the silicon nitride layer.

In some embodiments, the rear passivation layer 6 has a thickness in a range of 70 nm to 120 nm, which may be, for example, 70 nm, 80 nm, 90 nm, 100 nm, 120 nm, or the like, and may also be other values in the above range, which is not limited herein.

In some embodiments, the front electrode 7 and the rear electrode 8 are metal electrodes. The metal electrode may be made of at least one of copper, silver, aluminum, or nickel. When being made of copper, silver, aluminum, and nickel, the metal electrode may easily be corroded.

The metal electrode includes a busbar and a finger. The finger is connected to the busbar. The finger is configured to converge currents generated by the solar cell. The busbar is configured to collect currents from the finger.

In some embodiments of the present disclosure, a plurality of busbars are equally spaced, so that the currents collected by each busbar are more uniform.

Figure 2:
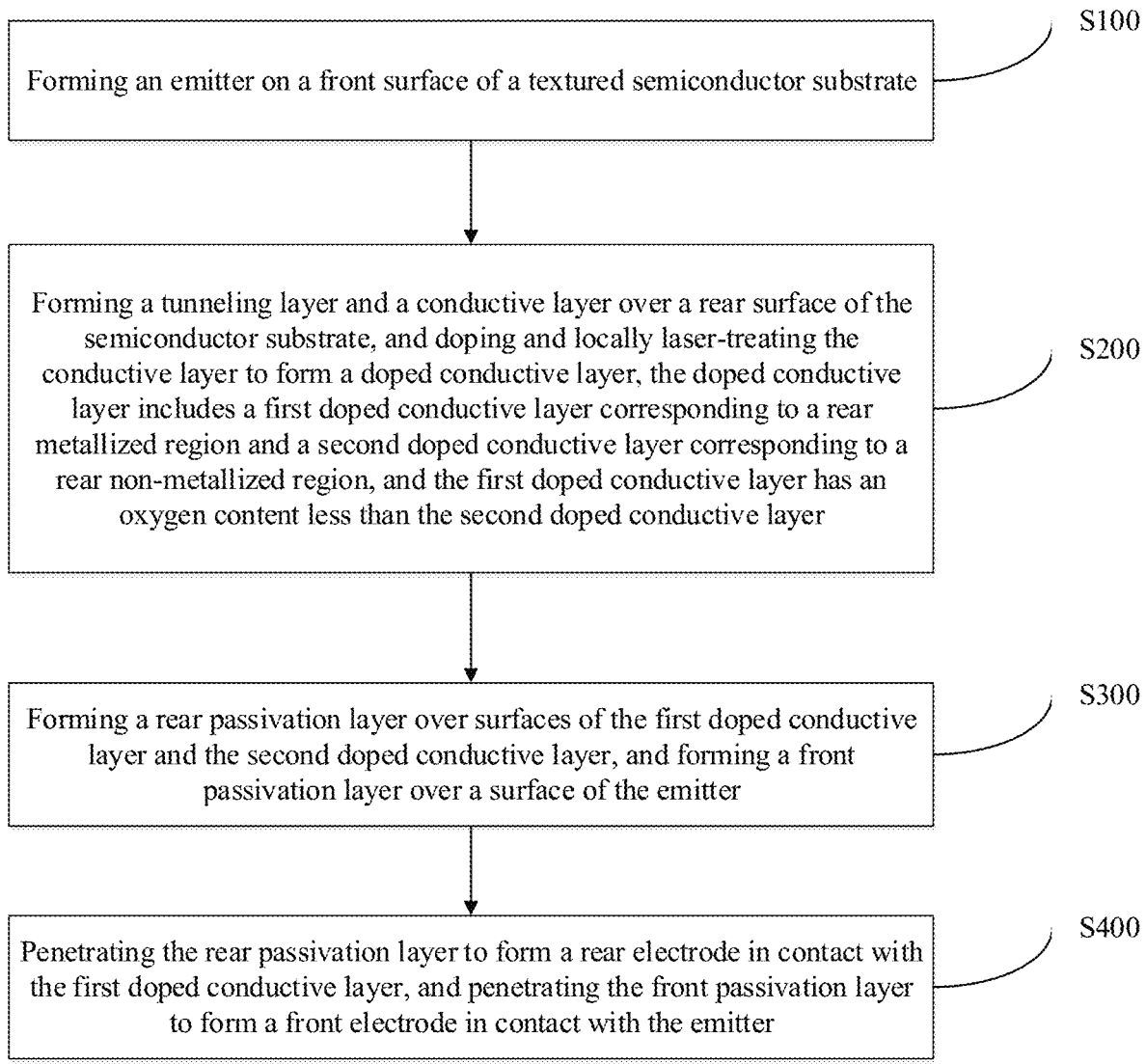
FIG. 2 is a flowchart showing a manufacturing process of a solar cell according to one or more embodiments of the present disclosure.

The present disclosure further provides a method for manufacturing the solar cell described above. FIG. 2 is a flowchart of a method for manufacturing a solar cell according to one or more embodiments of the present disclosure. The method includes the following steps: forming an emitter 2 on a front surface of a textured semiconductor substrate 1; forming a tunneling layer 3 and a conductive layer over a rear surface of the semiconductor substrate 1, and doping and locally laser-treating the conductive layer to form a doped conductive layer 4, the doped conductive layer 4 includes a first doped conductive layer 41 corresponding to a rear metallized region and a second doped conductive layer 42 corresponding to a rear non-metallized region, and an oxygen content of the first doped conductive layer 41 is less than the second doped conductive layer 42; forming a rear passivation layer 6 on surfaces of the first doped conductive layer 41 and the second doped conductive layer 42 and forming a front passivation layer 5 on a surface of the emitter 2; and penetrating the rear passivation layer 6 to form a rear electrode 8 in contact with the first doped polysilicon layer and penetrating the front passivation layer 5 to form a front electrode 7 in contact with the emitter 2.

In some embodiments, the front surface of the semiconductor substrate 1 is a surface facing the sun (i.e., light receiving surface), and the rear surface of the semiconductor substrate 1 is a surface facing away from the sun (i.e., backlight surface).

The method for manufacturing a solar cell according to the present disclosure may be used to manufacture an N-type solar cell, and may be further used to manufacture an N-type TOPCon solar cell. The method for manufacturing the N-type TOPCon solar cell according to the present disclosure will be clearly and fully described below with reference to the accompanying drawings in the embodiments of the present disclosure. The embodiments described are only some rather than all of the embodiments of the present disclosure.

Figure 3:
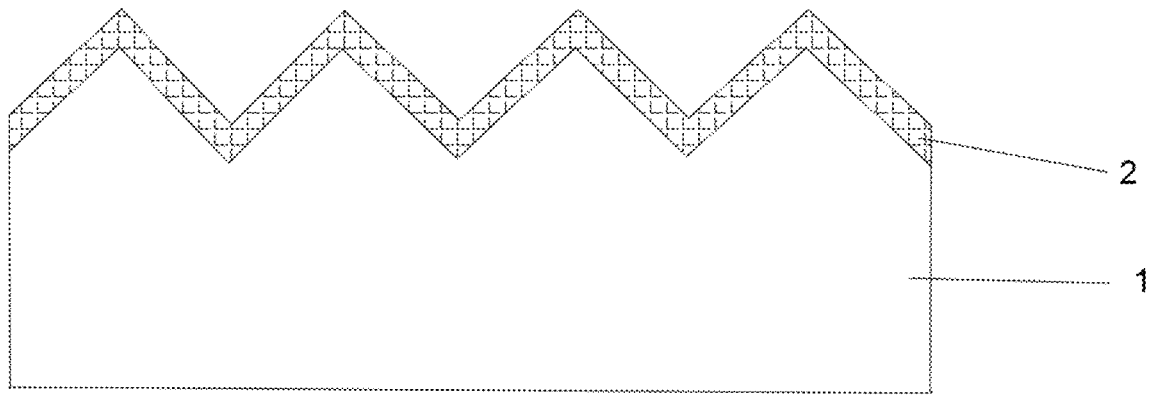
FIG. 3 is a schematic diagram showing a structure after an emitter is manufactured according to one or more embodiments of the present disclosure.

In step S100, referring to FIG. 3, an emitter 2 is formed on a front surface of a textured semiconductor substrate 1.

In some embodiments, the semiconductor substrate 1 is an N-type semiconductor substrate. The N-type semiconductor substrate may be a crystalline silicon substrate (silicon substrate), for example, may be one of a monocrystalline silicon substrate, a polycrystalline silicon substrate, a microcrystalline silicon substrate, or a silicon carbide substrate. The specific type of the semiconductor substrate is not limited in the embodiments of the present disclosure. Doping elements of the semiconductor substrate may be phosphorus, nitrogen, and the like.

In some embodiments, the front surface and the rear surface of the semiconductor substrate 1 may be textured, to form a textured or surface texture structure (e.g., a pyramid structure). The texturing may be, for example, chemical etching, laser etching, a mechanical process, or plasma etching, which is not limited herein. For example, the front surface and the rear surface of the semiconductor substrate 1 may be textured using a NaOH solution. Due to anisotropy of corrosion of the NaOH solution, a pyramid textured structure may be manufactured.

It may be understood that the surface of the semiconductor substrate 1 is textured to have a textured structure, which produces a light trapping effect and increases an amount of light absorbed by the solar cell, so as to improve the conversion efficiency of the solar cell.

In some embodiments, prior to the texturing, a step of cleaning the N-type semiconductor substrate 1 may also be included to remove metal and organic contaminants from the surface of the semiconductor substrate.

In some embodiments, the emitter 2 may be formed on the front surface of the semiconductor substrate 1 by any one or more of high-temperature diffusion, paste doping, or ion implantation. The emitter 2 may be formed by diffusing boron atoms through a boron source. In some embodiments, the emitter 2 is designed to be a selective emitter. For example, boron tribromide may be used as the boron source for diffusion, so that a microcrystalline silicon phase of crystalline silicon is transformed into a polycrystalline silicon phase. Due to a high concentration of boron on the surface of the semiconductor substrate 1, a layer of borosilicate glass (BSG) is generally formed. This layer of BSG has a metal impurity absorption effect, which may adversely affect normal operation of the solar cell and thus is required to be removed later.

Figure 4:
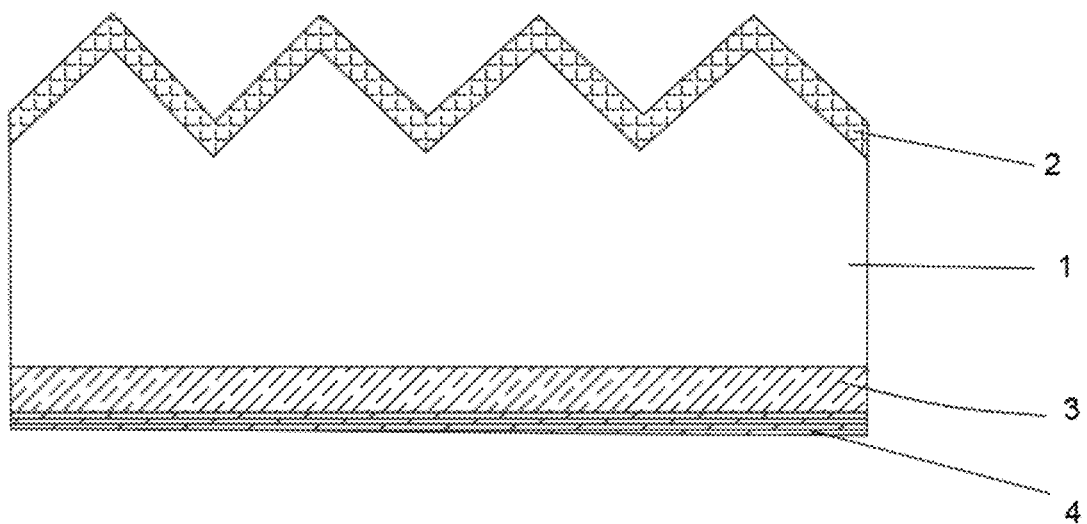
FIG. 4 is a schematic diagram showing a structure after doping treatment and local laser treatment of a conductive layer according to one or more embodiments of the present disclosure.

In step 200, referring to FIG. 4, a tunneling layer 3 and a conductive layer are formed on a rear surface of the semiconductor substrate 1, and the conductive layer is doped and locally laser-treated to form a doped conductive layer 4. The doped conductive layer 4 includes a first doped conductive layer 41 corresponding to a rear metallized region and a second doped conductive layer 42 corresponding to a rear non-metallized region, and oxygen content of the first doped conductive layer 41 is less than the second doped conductive layer 42.

In some embodiments, the tunneling layer 3 may be formed on the rear surface of the semiconductor substrate 1, and then the doped polysilicon layer 4 may be formed on the surface of the tunneling layer 3.

In some embodiments, a specific operation manner of forming an oxide layer is not limited in the embodiments of the present disclosure. For example, the rear surface of the semiconductor substrate 1 may be oxidized by any one of ozone oxidation, high-temperature thermal oxidation, or nitric acid oxidation.

In some embodiments, a specific operation manner of forming the conductive layer is not limited in the embodiments of the present disclosure. For example, the conductive layer may be deposited on the surface of the tunneling layer by any one of low-pressure chemical vapor deposition, plasma enhanced chemical vapor deposition, or atmospheric chemical vapor deposition to protect the oxide layer. In addition, the conductive layer is doped to form high and low junctions (n/n$^+$-Si), which can effectively reduce a recombination rate of charge carriers on the rear surface of the solar cell, and can further improve the conversion efficiency of the solar cell.

In some embodiments, the conductive layer is deposited and in-situ doping is performed simultaneously to form the doped conductive layer 4. The doped conductive layer 4 includes at least one of silicon carbide or polysilicon. That is, the doped conductive layer 4 may be a doped polysilicon layer, or a silicon carbide layer, or a composite layer of a doped polysilicon layer and a silicon carbide layer.

In some embodiments, when the doped conductive layer 4 is a phosphorus-doped polysilicon layer, a phosphorus-doped source may be prepared by any one or more of high-temperature diffusion, paste doping, or ion implantation.

In some embodiments, the metallized region refers to a region where the rear electrode 8 penetrates the rear passivation layer 6 into contact with the doped polysilicon layer, while the non-metallized region refers to other regions on the doped polysilicon layer. It may be understood that the doped polysilicon layer 4 is composed of a first doped polysilicon layer 41 and a second doped polysilicon layer 42 arranged at intervals.

In some embodiments, when the doped conductive layer 4 is a phosphorus-doped polysilicon layer, a doping source for local laser treatment is phosphorosilicate glass on the surface of the doped polysilicon layer and inactivated phosphorus in the polysilicon layer. The phosphorus is activated by laser to form a heavily doped polysilicon layer with higher phosphorus concentration.

In some embodiments, laser for local laser treatment includes green light with a wavelength of 532 nm, as well as laser in other wavelength ranges, which is not limited herein.

In some embodiments, a pulse width for local laser treatment ranges from 15 ns to 40 ns. The pulse width for local laser treatment may be, for example, 15 ns, 18 ns, 20 ns, 25 ns, 26 ns, 29 ns, 30 ns, 32 ns, 35 ns, or 40 ns.

In some embodiments, a laser frequency for local laser treatment ranges from 100 KHz to 400 KHz. The laser frequency for local laser treatment may be, for example, 100 KHz, 150 KHz, 200 KHz, 250 KHz, 300 KHz, 350 KHz, or 400 KHz.

In some embodiments, integrated laser energy for local laser treatment ranges from 0.1 J*cm$^{-2}$ to 0.2 J*cm$^{-2}$. The integrated laser energy for local laser treatment may be, for example, 0.1 J*cm$^{-2}$, 0.13 J*cm$^{-2}$, 0.15 J*cm$^{-2}$, 0.18 J*cm$^{-2}$, or 0.2 J*cm$^{-2}$.

The applicant finds that, if the pulse width, the laser frequency, and the integrated laser energy for local laser treatment are controlled within the above limited ranges, a heavily doped region can be guaranteed to be formed in the metallized region.

In some embodiments, the conductive layer is doped, and concentration of the doped conductive layer 4 obtained after the doping ranges from 8E19 cm$^{-3}$ to 5E20 cm$^{-3}$. Then, the doped conductive layer 4 in the metallized region is locally laser-treated. During the local laser treatment, laser acts on the doped conductive layer 4, thus causing the polycrystalline silicon in the metallized region to melt and recrystallize. In this process, more phosphorus elements occupy silicon crystal lattices, which increases the concentration of the phosphorus elements in the doped conductive layer (i.e., the first doped conductive layer 41) of the metallized region, thereby forming the heavily doped region. The concentration of the phosphorus elements in the first doped conductive layer 41 ranges from 1E20 cm$^{-3}$ to 1E21 cm$^{-3}$. The concentration of the phosphorus elements in the first doped conductive layer 41 may be, for example, 1E20 cm$^{-3}$, 2E20 cm$^{-3}$, 3E20 cm$^{-3}$, 4E20 cm$^{-3}$, 5E20 cm$^{-3}$, 6E20 cm$^{-3}$, 7E20 cm$^{-3}$, 8E20 cm$^{-3}$, 9E20 cm$^{-3}$, or 1E21 cm$^{-3}$. The concentration of phosphorus elements in the doped conductive layer (the second doped conductive layer 42) in the non-metallized region still remains unchanged. That is, the concentration of phosphorus elements in the second doped conductive layer 42 ranges from 8E19 cm$^{-3}$ to 5E20 cm$^{-3}$. The concentration of phosphorus elements in the second doped conductive layer 42 may be, for example, 8E19 cm$^{-3}$, 9E19 cm$^{-3}$, 1E20 cm$^{-3}$, 2E20 cm$^{-3}$, 3E20 cm$^{-3}$, 4E20 cm$^{-3}$, or 5E20 cm$^{-3}$.

In some embodiments, due to laser heavy doping on the doped conductive layer in the metallized region, film elements in the doped conductive layer in the metallized region are changed. Nitrogen elements in the doped conductive layer located in the metallized region increase. That is, nitrogen content of the first doped conductive layer 41 is greater than the second doped conductive layer 42. For example, a mass ratio of nitrogen elements in the first doped conductive layer 41 ranges from 3% to 5%, and a mass ratio of nitrogen elements in the second doped conductive layer 42 ranges from 1% to 2%. Content of oxygen elements in the doped conductive layer in the metallized region decreases, and the oxygen content of the first doped conductive layer 41 is less than the second doped conductive layer 42. Content of oxygen elements in the first doped conductive layer 41 ranges from 19% to 22%, and content of oxygen elements in the second doped conductive layer 42 ranges from 27% to 28%. According to the present disclosure, the oxygen content of the first doped conductive layer 41 is controlled to be less than the second doped conductive layer 42, so that recombination centers on the rear surface of the solar cell can be reduced, and mechanical damages caused by laser treatment of the metallized region can be compensated. In addition, the nitrogen content of the first doped conductive layer 41 is controlled to be greater than the second doped conductive layer 42, so that the solar cell manufactured brings a good passivation effect as well as good conductivity, thereby improving the performance of the solar cell.

In some embodiments, due to laser heavy doping on the doped conductive layer in the metallized region, content of oxygen elements in the tunneling layer 3 in the metallized region is increased. That is, oxygen content of the first tunneling layer 31 is greater than the second tunneling layer 32, so that bridging oxygen in the tunneling layer 3 is increased, thereby increasing the density of the tunneling layer 3. Thus, the tunneling effect of the tunneling layer 3 can be ensured and the problem of increasing holes in the tunneling layer caused by laser can be effectively solved, which ensures passivation performance of a laser heavily doped region, reduces metal contact of the solar cell, ensures the open-circuit voltage, and thus improves the efficiency of the solar cell.

In some embodiments, due to laser heavy doping on the doped conductive layer in the metallized region, content of oxygen elements at interfaces between the doped conductive layer and the tunneling layer 3 in the metallized region is increased. That is, oxygen content at an interface between the first doped conductive layer 41 and the first tunneling layer 31 is greater than at an interface between the second doped conductive layer 42 and the second tunneling layer 32. The increase in the content of oxygen elements at the interfaces between the doped conductive layer and the tunneling layer 3 can improve the film quality of the tunneling layer 3 in the metallized region and can further improve the passivation effect of the solar cell.

Figure 5:
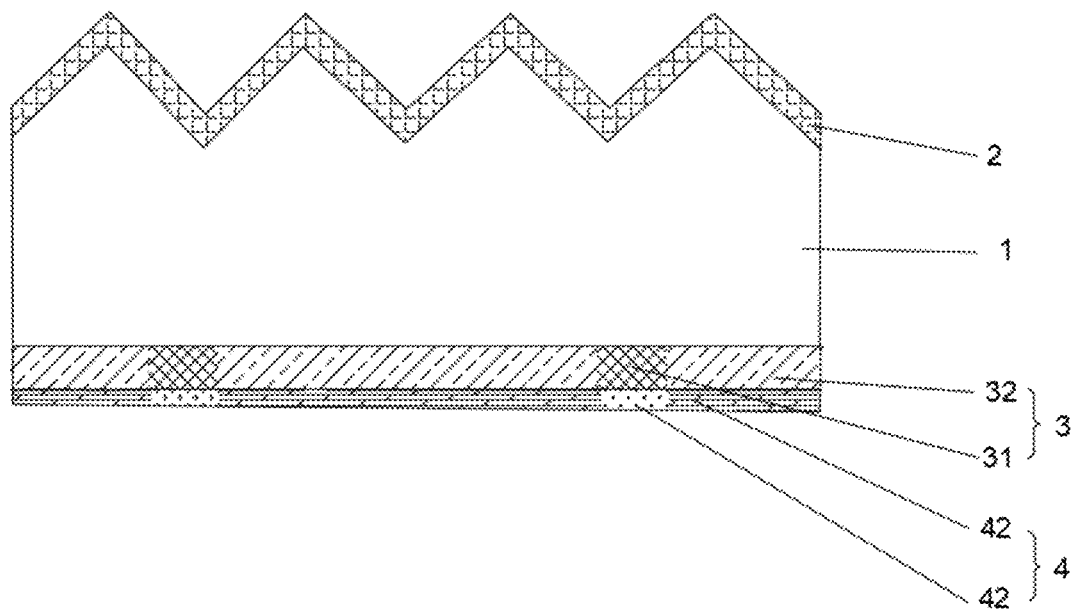
FIG. 5 is a schematic structural diagram of forming of a front passivation layer and a rear passivation layer over a front surface and a rear surface of a semiconductor substrate according to one or more embodiments of the present disclosure.

In step S300, referring to FIG. 5, a rear passivation layer 6 is formed on surfaces of the first doped conductive layer 41 and the second doped conductive layer 42 and a front passivation layer 5 is formed on a surface of the emitter 2.

In some embodiments, due to laser heavy doping on the doped conductive layer in the metallized region, content of oxygen elements at interfaces between the doped conductive layer and the rear passivation layer 6 in the metallized region is increased. That is, oxygen content at an interface between the first doped conductive layer 41 and the rear passivation layer 6 is greater than at an interface between the second doped conductive layer 42 and the rear passivation layer 6. The increase of the content of oxygen elements at the interfaces between the doped conductive layer and the rear passivation layer 6 can improve the film quality of the rear passivation layer 6 in the metallized region and can further improve the passivation effect of the solar cell.

In some embodiments, a rear passivation layer 6 is formed on surfaces of the first doped conductive layer 41 and the second doped conductive layer 42. The rear passivation layer 6 may include, but is not limited to, at least one of silicon oxide, silicon nitride, silicon oxynitride, alumina, or any combination thereof.

For example, the rear passivation layer 6 is made of silicon nitride. A silicon nitride film may act as an antireflection film, and the silicon nitride film has good insulation, compactness, stability and is capable of masking impurity ions. The silicon nitride film can passivate the semiconductor substrate 1, which significantly improves photoelectric conversion efficiency of the solar cell.

In some embodiments, the rear passivation layer 6 has a thickness in a range of 70 nm to 120 nm, which may be, for example, 70 nm, 80 nm, 90 nm, 100 nm, 120 nm, or the like, and may also be other values in the above range, which is not limited herein.

In some embodiments, when the rear passivation layer 6 is a stack of a silicon nitride layer and a silicon oxide layer or a stack of a silicon nitride layer and a silicon oxynitride layer, the silicon nitride layer is located on a surface of the doped conductive layer 4, and the silicon oxide layer or the silicon oxynitride layer is located on a surface of the silicon nitride layer.

In some embodiments, the front passivation layer 5 may include, but is not limited to, at least one of silicon oxide, silicon nitride, silicon oxynitride, alumina, or any combination thereof. The front passivation layer 5 can have a good passivation effect on the semiconductor substrate 1, which is helpful to improve the conversion efficiency of the solar cell. It is to be noted that, the front passivation layer 5 can also serve to reduce the reflection of incident light, which may also be referred to as an antireflection layer in some embodiments.

In some embodiments, the front passivation layer 5 has a thickness in a range of 10 nm to 120 nm, which may be, for example, 10 nm, 20 nm, 30 nm, 42 nm, 50 nm, 60 nm, 70 nm, 80 nm, 90 nm, 100 nm, 120 nm, or the like, and may also be other values in the above range, which is not limited herein.

In step S400, referring to FIG. 1, the rear passivation layer 6 is penetrated to form a rear electrode 8 in contact with the first doped polysilicon layer 41 and the front passivation layer 5 is penetrated to form a front electrode 7 in contact with the emitter 2.

In some embodiments, on the front surface of the semiconductor substrate 1, a front busbar and a front finger are printed with paste and dried to form the corresponding front electrode 7. In some embodiments, on the rear surface of the semiconductor substrate 1, a rear busbar and a rear finger may be printed with paste and dried to form the corresponding rear electrode 8. Finally, dried solar cells are sintered to manufacture the solar cell.

Specific materials of the front electrode 7 and the rear electrode 8 are not limited in the present disclosure. For example, the front electrode 7 is a silver electrode or a silver/aluminum electrode, and the rear electrode 8 is a silver electrode or a silver/aluminum electrode.

It is to be noted that, in the present disclosure, the steps may or may not be performed in order unless otherwise specified. The order of the steps for manufacturing the solar cell is not limited in the embodiments of the present disclosure, which may be adjusted according to an actual manufacturing process.

In a third aspect, a photovoltaic module 1000 is provided, including a solar cell string formed by the solar cells described above through electrical connection.

Figure 6:
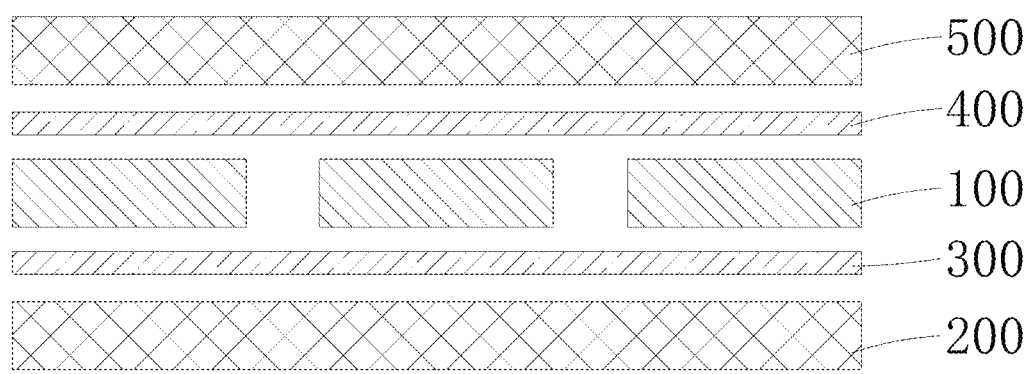
FIG. 6 is a schematic structural diagram of a photovoltaic module according to one or more embodiments of the present disclosure.

In an embodiment, referring to FIG. 6, the photovoltaic module 1000 includes a first cover plate 200, a first sealant layer 300, a solar cell string, a second sealant layer 400, and a second cover plate 500.

In some embodiments, the solar cell string includes a plurality of solar cells 100 as described above that are connected by conductive bands. The solar cells 100 may be connected by partial stack or by splicing.

In some embodiments, the first cover plate 200 and the second cover plate 500 may be transparent or opaque cover plates, such as glass cover plates or plastic cover plates.

Two sides of the first sealant layer 300 contact and fit the first cover plate 200 and the solar cell string, respectively, and two sides of the second sealant layer 400 contact and fit the second cover plate 500 and the solar cell string, respectively. The first sealant layer 300 and the second sealant layer 400 may be an ethylene-vinyl acetate copolymer (EVA) adhesive film, a polyethylene octene co-elastomer (POE) adhesive film or a polyethylene terephthalate (PET) adhesive film.

Side edges of the photovoltaic module 1000 may also be completely packaged. That is, the side edges of the photovoltaic module 1000 are fully packaged with a packaging adhesive tape to prevent lamination deviation during the lamination of the photovoltaic module 1000.

The photovoltaic module 1000 further includes an edge sealing member fixedly packaged to a partial edge of the photovoltaic module 1000. The edge sealing member may be fixedly packaged to an edge near the corner of the photovoltaic module 1000. The edge sealing member may be a high-temperature resistant tape. The high-temperature resistant tape has excellent high-temperature resistance and may not decompose or fall off during the lamination, which can ensure the reliable packaging of the photovoltaic module 1000. Two ends of the high-temperature resistant tape are fixed to the second cover plate 500 and the first cover plate 200, respectively. The two ends of the high-temperature resistant tape may be bonded to the second cover plate 500 and the first cover plate 200, respectively, and the middle portion thereof can limit the side edge of the photovoltaic module 1000 to prevent lamination deviation of the photovoltaic module 1000 during the lamination.

In some embodiments, the photovoltaic module 1000 further includes a frame (the frame is not shown in FIG. 6). The frame may be made of an aluminum alloy or stainless steel. When the frame is made of the aluminum alloy, the frame has good strength and corrosion resistance. The frame may support and protect an entire solar panel. The photovoltaic module may also be connected to an external photovoltaic frame through the frame, and a plurality of photovoltaic modules may be connected to each other to form a photovoltaic power station.

The above are merely some embodiments of the present disclosure, and are not intended to limit the present disclosure. Any modification, equivalent replacement, improvement and the like within the principle of the present disclosure all fall within the protection scope of the present disclosure.

What is claimed is:

1. A solar cell, comprising:
a semiconductor substrate including a front surface and a rear surface arranged opposite to each other, wherein the rear surface includes at least one rear metalized region and at least one rear non-metallized region that are alternately arranged;
an emitter located on the front surface of the semiconductor substrate;
a front passivation layer located over a surface of the emitter;
a tunneling layer located over the rear surface of the semiconductor substrate;
a doped conductive layer located over a surface of the tunneling layer;
a rear passivation layer located over a surface of the doped conductive layer;
a front electrode in contact with the emitter; and
a rear electrode in contact with the doped conductive layer,
wherein the doped conductive layer includes a first doped conductive layer corresponding to the at least one rear metallized region, and a second doped conductive layer corresponding to the at least one rear non-metallized region,
wherein the first doped conductive layer has an oxygen content less than the second doped conductive layer,
wherein the tunneling layer includes a first tunneling layer corresponding to the at least one rear metallized region and a second tunneling layer corresponding to the at least one rear non-metallized region, and the first tunneling layer has an oxygen content greater than the second tunneling layer, and
wherein an oxygen content at an interface between the first doped conductive layer and the first tunneling layer is greater than an oxygen content at an interface between the second doped conductive layer and the second tunneling layer.

2. The solar cell according to claim 1, wherein an oxygen content at an interface between the first doped conductive layer and the rear passivation layer is greater than an oxygen content at an interface between the second doped conductive layer and the rear passivation layer.

3. The solar cell according to claim 1, wherein the oxygen content of the first doped conductive layer is less than the oxygen content of the first tunneling layer.

4. The solar cell according to claim 1, wherein a mass ratio of oxygen element in the first doped conductive layer ranges from 19% to 22%.

5. The solar cell according to claim 1, wherein a mass ratio of oxygen element in the first tunneling layer ranges from 25% to 30%.

6. The solar cell according to claim 1, wherein the first doped conductive layer has a nitrogen content greater than the second doped conductive layer.

7. The solar cell according to claim 6, wherein a mass ratio of nitrogen element in the first doped conductive layer ranges from 3% to 5%.

8. The solar cell according to claim 1, wherein the doped conductive layer comprises at least one of silicon carbide or polysilicon.

9. The solar cell according to claim 1, wherein the first doped conductive layer and the second doped conductive layer are phosphorus-doped layers, and a concentration of phosphorus element in the first doped conductive layer is greater than a concentration of phosphorus element in the second doped conductive layer.

10. The solar cell according to claim 9, wherein the concentration of phosphorus element in the first doped conductive layer ranges from $1E20$ $cm^{-3}$ to $1E21$ $cm^{-3}$, and the concentration of phosphorus element in the second doped conductive layer ranges from $8E19$ $cm^{-3}$ to $5E20$ $cm^{-3}$; and/or a sheet resistance of the first doped conductive layer ranges from 30 $\Omega$/sq to 80 $\Omega$/sq, and a sheet resistance of the second doped conductive layer ranges from 60 $\Omega$/sq to 400 $\Omega$/sq; and/or the first doped conductive layer has a thickness in a range of 30 nm to 300 nm, and the second doped conductive layer has a thickness in a range of 30 nm to 300 nm.

11. A photovoltaic module, comprising a cover plate, a packaging material layer, and a solar cell string, wherein the solar cell string comprises a plurality of solar cells and at least one of the plurality of solar cells comprises:
a semiconductor substrate including a front surface and a rear surface arranged opposite to each other, wherein the rear surface includes at least one rear metalized region and at least one rear non-metallized region that are alternately arranged;
an emitter located on the front surface of the semiconductor substrate;
a front passivation layer located over a surface of the emitter;
a tunneling layer located over the rear surface of the semiconductor substrate;
a doped conductive layer located over a surface of the tunneling layer;
a rear passivation layer located over a surface of the doped conductive layer;
a front electrode in contact with the emitter; and
a rear electrode in contact with the doped conductive layer,
wherein the doped conductive layer includes a first doped conductive layer corresponding to the at least one rear metallized region, and a second doped conductive layer corresponding to the at least one rear non-metallized region,
wherein the first doped conductive layer has an oxygen content less than the second doped conductive layer,
wherein the tunneling layer includes a first tunneling layer corresponding to the at least one rear metallized region and a second tunneling layer corresponding to the at least one rear non-metallized region, and the first tunneling layer has an oxygen content greater than the second tunneling layer, and wherein an oxygen content at an interface between the first doped conductive layer and the first tunneling layer is greater than an oxygen content at an interface between the second doped conductive layer and the second tunneling layer.

12. The photovoltaic module according to claim 11, wherein an oxygen content at an interface between the first doped conductive layer and the rear passivation layer is greater than an oxygen content at an interface between the second doped conductive layer and the rear passivation layer.

13. The photovoltaic module according to claim 11, wherein the oxygen content of the first doped conductive layer is less than the oxygen content of the first tunneling layer.

14. The photovoltaic module according to claim 11, wherein a mass ratio of oxygen element in the first doped conductive layer ranges from 19% to 22%.

15. The photovoltaic module according to claim 11, wherein a mass ratio of oxygen element in the first tunneling layer ranges from 25% to 30%.

16. The photovoltaic module according to claim 11, wherein the first doped conductive layer has a nitrogen content greater than the second doped conductive layer.

17. The solar cell according to claim 1, wherein along a length direction of the semiconductor substrate, an orthographic projection of the first tunneling layer does not overlap with an orthographic projection of the second doped conductive layer.

* * * * *